United States Patent [19]

Philipp

[11] Patent Number: 4,475,151
[45] Date of Patent: Oct. 2, 1984

[54] SWITCHING AMPLIFIER CIRCUIT

[76] Inventor: Harald Philipp, 5600 SW. 206th, Aloha, Oreg. 97007

[21] Appl. No.: 439,056

[22] Filed: Nov. 4, 1982

[51] Int. Cl.³ ............................................ H02M 7/02
[52] U.S. Cl. ...................................... 363/63; 318/696
[58] Field of Search .............. 318/291, 293, 300, 696, 318/803; 363/63

[56] References Cited

U.S. PATENT DOCUMENTS

| | | |
|---|---|---|
| 1,960,350 | 5/1934 | Shackleton et al. . |
| 2,443,347 | 6/1948 | Field . |
| 2,914,717 | 11/1959 | Redding . |
| 3,210,626 | 10/1969 | Wierzbicki . |
| 3,418,560 | 12/1968 | Petersen ................................ 363/63 |
| 3,560,821 | 2/1971 | Beling . |
| 3,684,945 | 8/1972 | Hermansson et al. .......... 318/293 X |
| 3,752,189 | 8/1973 | Marr et al. . |
| 4,087,732 | 5/1978 | Pritchard . |
| 4,100,471 | 7/1978 | Pritchard . |

*Primary Examiner*—William M. Shoop

*Attorney, Agent, or Firm*—Kolisch, Hartwell, Dickinson & Anderson

[57] ABSTRACT

A switching current supply circuit, in response to a control voltage, controls the current flowing in an inductive load. Included is a pair of terminals adapted for connection to such a load and a bridge network connected to the terminals for producing a voltage indicative of the current flowing through the load. A comparator switches an output voltage between two distinct values in response to a differential input voltage having components derived, at least in part from the control voltage and the load-current-indicating voltage. Finally, a polarity-changeable voltage source, in response to the output voltage, applies, selectively and reversibly, known voltages of opposite polarity through the bridge network to the load-connectable terminals. These known voltages effect a change in load current level appropriate to decrease the absolute value of the above-mentioned input voltage. Optionally, this circuit also includes an adjustable hysteresis circuit connected to the comparator for delaying switching therein by a known period of time. The circuit may also be constructed to minimize common mode voltage.

7 Claims, 3 Drawing Figures

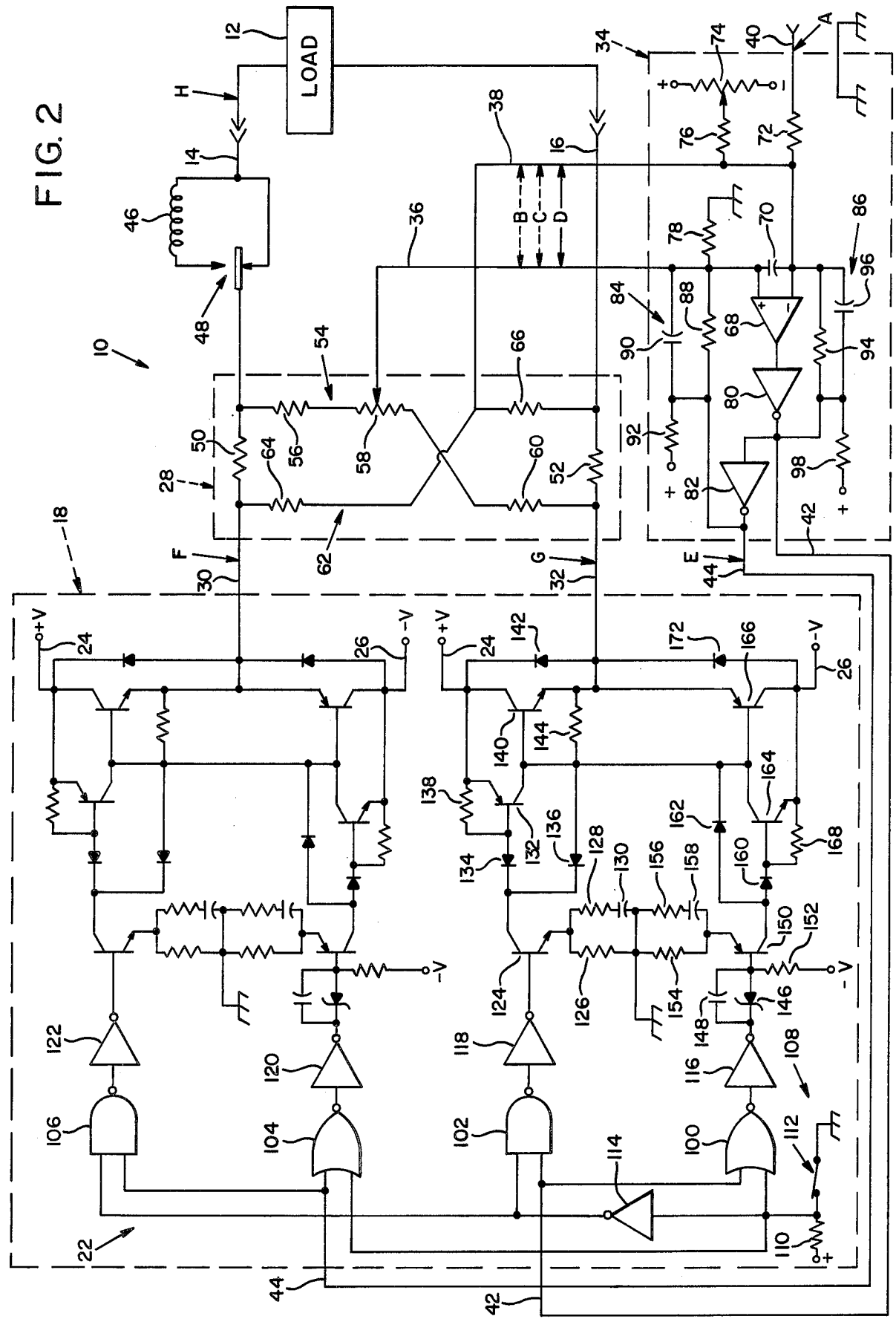

4,475,151

SWITCHING AMPLIFIER CIRCUIT

BACKGROUND AND SUMMARY OF THE INVENTION

This invention pertains to a switching amplifier circuit for controlling an inductive load, and in particular, to such a circuit which applies, selectively and reversibly, voltages of opposite polarity to such a load in response to a control voltage indicative of the desired average load current.

A circuit made in conformance with this invention provides an adjustable average current to an inductive load, such as a stepping motor. In operating such a motor, a DC voltage is applied, successively and cyclically, to each of the motor windings. A stepping motor winding can be viewed as an inductive load having a resistance. When a DC voltage is applied to such a winding, the current ramps reverse exponentially in a direction corresponding to the applied voltage. In many conventional circuits, the voltage source is turned off, once a desired maximum current has been attained, until the current falls to a level below the desired current, at which time it is turned on again. This cyclical operation maintains essentially a constant average current level in the winding. Alternatively, a winding may be center-tapped, which tap is either connected to a fixed voltage source or to ground. The opposite ends of the winding are then alternatively connected, appropriately, to the power supply or ground through a switch such as a transistor.

Additionally, the feedback for current-source-switching amplifiers has been accomplished conventionally by the use of resistive dividers and operational amplifiers. These components inherently limit the feedback response time and hence switching rate. Another circuit known to the applicant uses a pulse-controlled Schmitt trigger to control the conductivity of a transistor switch connecting a winding terminal to ground.

These prior art techniques tend to have significant ground return current. Also, these circuits do not provide for adjusting the dither current range, and therefore, frequency, above and below the average current level.

It is therefore a general object of this invention to overcome the above-described disadvantages of the prior art techniques.

It is specifically an object to provide a fast-switching amplifier circuit, responsive to an external voltage signal, for adjustably controlling the average current of an inductive load.

It is also an object to provide such a circuit having a current-sensing circuit with a common mode voltage near zero, and having both minimum circuit ground return current levels and minimum grounding noise.

A further object is to include adjustable hysteresis circuitry in the amplifier circuit for varying the magnitude and as a result, the frequency, of the load current relative to a desired average current.

An object of the present invention is also to provide a circuit which permits the doubling of the drive voltage across the load impedance as compared to normal ground return drives, thereby permitting the doubling of available slew rate capability.

In the preferred embodiment of the present invention, an essentially balanced bridge network is connected to terminals which are connectable to an inductive load. This network contains a resistance in series with each terminal. Cross-over resistance paths are also provided from the load side of each in-line resistance to the non-load side of the other in-line resistance. A voltage is taken between intermediate taps disposed in the cross-over resistance lines to indicate the current level in the load. A differential voltage existing at a comparator input has components derived from this load-current-indicating voltage and a control voltage to produce a pair of digital binary outputs which are complementary with respect to each other. A source connects, selectively and reversibly, power supply voltages of equal magnitude and opposite polarity to the load terminals in response to the digital outputs of the comparator. Hysteresis circuitry is connected to the comparator to cause it to switch when the load current varies from the desired load current by a known range.

With the bridge network and applied terminal voltages balanced about a ground or zero level, there is a near zero common mode current-sensing feedback voltage and near zero ground return current. By making the comparator responsive to an input control voltage, the load current may be adjusted for operation at different levels. The hysteresis also provides for operating the switching amplifier circuit at a frequency which is appropriate for a particular load.

These and additional objects and advantages of the present invention will be more clearly understood from a consideration of the drawings and the following detailed description of the preferred embodiment.

BRIEF DESCRIPTION OF THE DRAWINGS

FIG. 2 is a circuit diagram of the circuit shown in FIG. 1.

DESCRIPTION OF THE PREFERRED EMBODIMENT

Circuit Structure

Figure 1:
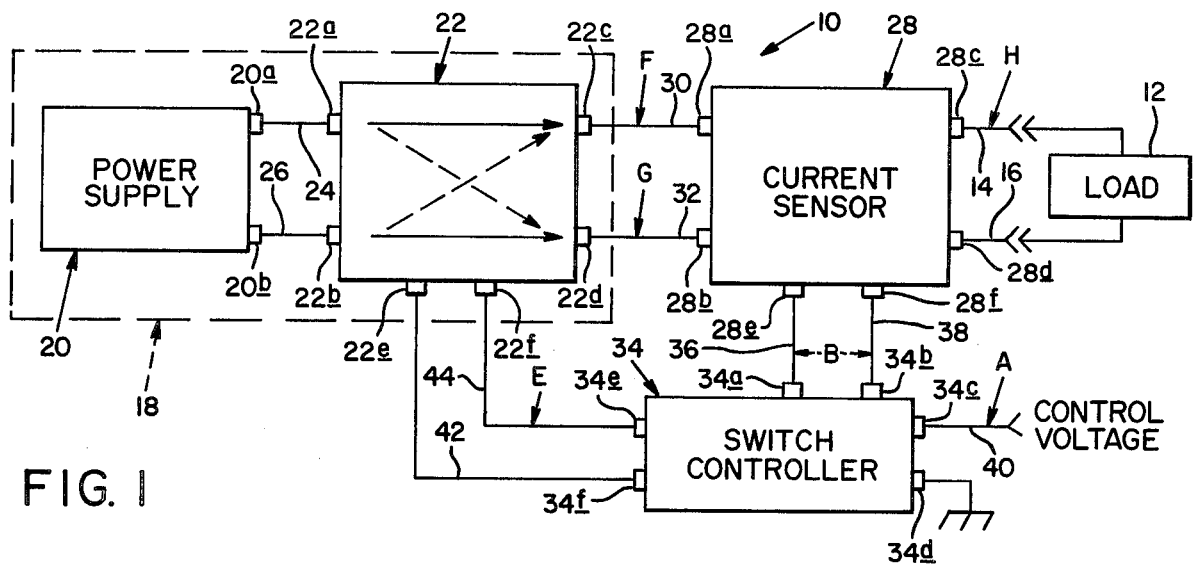
FIG. 1 is a schematic diagram of a switching amplifier circuit made in conformance with this invention.

Referring initially to FIG. 1, a switching current supply circuit, shown generally at 10, is connected to an inductive load 12, such as a stepping motor winding, via two load terminals 14, 16. Circuit 10 includes a polarity-changeable voltage source 18, shown outlined in dashed lines. Source 18 includes a power supply 20 which is connected to a switching circuit 22. Specifically, a power lead 24 connects a positive voltage power supply terminal 20a to a switching circuit power input terminal 22a. Correspondingly, a second power lead 26 connects a negative voltage power supply terminal 20b to a second switching circuit input power terminal 22b. A pair of switching circuit output power terminals 22c, 22d are connected to corresponding sensor input power terminals 28a, 28b by leads 30, 32, respectively. Sensor 28 has output power terminals 28c, 28d which are connected to load terminals 14, 16, respectively.

As will be discussed in greater detail later, when circuit 10 is connected to an inductive load 12, sensor 28 produces, across terminals 28e, 28f, a voltage indicative of the load current. This voltage is conveyed to terminals 34a, 34b of a switch controller 34, also referred to herein as comparator means, through conductors 36, 38, as shown. Controller 34 also receives an externally derived control voltage on an additional pair of terminals 34c, 34d. Terminal 34d is actually connected to chassis ground. The control voltage is applied to terminal 34c by a control voltage input terminal 40.

Controller 34 responds to the control voltage and the load-current-indicating voltage to produce a pair of binary output signals on terminals 34e, 34f. The signals on these latter two terminals are, logically speaking, of opposite values. In other words, when one terminal is at a logic "1" state, the other terminal is at a logic "0" state. It could also be said that the signals on these two terminals are complements of each other.

Switching circuit 22 alternately connects terminals 22a, 22b to terminals 22c, 22d, respectively, and to 22d, 22c, respectively. The particular switching configuration depends on the particular values of signals it receives on control input terminals 22e, 22f which are connected via conductors 42, 44 to controller terminals 34f, 34e, respectively.

Referring now to FIG. 2 and discussing the structure of circuit 10 in detail, current source 18, current sensor 28 and switch controller 34 are shown outlined in dashed lines. It should also be noted that a switchable inductive load 46 has been added to the circuit. A switch 48 allows for optionally adding inductive load 46 to load 12 or bypassing it, as is shown. This feature allows for use of the circuit on loads which otherwise have an inadequate inductive impedance.

Referring initially to sensor 28, an essentially balanced bridge network is shown having an in-line resistor in series with each load terminal and associated cross-over lines connecting opposite ends of the in-line resistors. Specifically, in-line resistors 50, 52 are interposed conductor 30 and terminal 14 and interposed conductor 32 and terminal 16, respectively. A first cross-over line, shown generally at 54, connects the load side of resistor 50 with the non-load side of resistor 52. It includes, in series, beginning with the connection adjacent resistor 50, a resistor 56, an intermediate-tapped trim pot 58 and a resistor 60. A second cross-over line, shown generally at 62, is like cross-over line 54 without the trim pot. Beginning with the non-load side of resistor 50, line 62 includes resistors 64, 66. The resistances in lines 54, 62 are also referred to herein as intermediately tappable resistance means.

It will be noted in the list of component values which follows this discussion that in-line resistors 50 and 52 are of equal value as are resistors 56, 60, 64 and 66. The value of trim pot 58 is small relative to the value of the other resistors in the cross-over line. Additionally, the values of in-line resistors 50, 52 are extremely small in order to avoid increasing the power consumption of the circuit. Previously mentioned conductor 36 is connected to the intermediate tap of trim pot 58. Conductor 38 is connected to the junction between resistors 64, 66.

Referring now to switch controller 34, conductors 36, 38 are connected directly to the positive and negative input terminals, respectively, of a comparator 68. A capacitor 70 is interposed these two input terminals. Conductor 38 is also connected through a resistor 72 to control voltage terminal 40, as well as to the center tap of a second trim pot 74 through a resistor 76. The opposite ends of trim pot 74 are connected respectively to equal and opposite reference voltages. Conductor 36 is connected to circuit ground through a resistor 78.

The output of comparator 68 is connected to conductor 42 through an inverting amplifier 80, the output of which is connected to conductor 44 through another inverting amplifier 82.

A pair of substantially identical subcircuits, shown generally as 84, 86, also referred to herein as hysteresis means, connect, respectively, conductor 36 with conductor 44 and conductor 38 with conductor 42. Subcircuit 84 includes a resistor 88 in parallel with a capacitor 90 and also a resistor 92 interposed conductor 44 and a positive reference voltage.

Similarly, subcircuit 86 includes a resistor 94 in parallel with a capacitor 96, as well as a resistor 98 interposed conductor 42 and a positive reference voltage.

Continuing to discuss the structure of supply circuit 10 and directing attention specifically now to current source 18, conductors 42, 44 are connected each to inputs of separate NAND and NOR gates. Specifically, conductor 42 is connected to NOR gate 100 and NAND gate 102, while conductor 44 is connected to NOR and NAND gates 104, 106, respectively.

An input of each of these logic gates is also connected to an enable circuit shown generally at 108. This circuit functions essentially as an on/off switch for the overall circuit operation. Circuit 108 includes a resistor 110 which is connected at one end to a positive reference voltage and at its other end to one terminal of a switch 112, the other terminal of which is connected to chassis ground. The junction between the switch and resistor is connected directly to input terminals of the two NOR gates and is also connected via an inverting amplifier 114 to input terminals of the NAND gates.

The output of logic gates 100, 102, 104, 106 are connected to the inputs of inverting amplifiers 116, 118, 120, 122, respectively.

It can be seen that the portion of current source 18 between conductor 44 and power lead 30 is identical to the circuit between conductor 42 and power lead 32. With the structure, and therefore the operation, of these two identical subcircuits being the same, the remainder of the circuit will be described with respect to the circuit portion between conductor 42 and lead 32 with the understanding that all comments presented are equally applicable to the other portion of the circuit not discussed.

The output of amplifier 118 is connected to the base of an n-p-n transistor 124, whose emitter is connected to ground through a resistor 126. Connected in parallel with resistor 126 is another resistor 128 in series with a capacitor 130. The collector of transistor 124 is connected to the base of a p-n-p transistor 132 through a diode 134, the anode of which is connected to the base of transistor 132. The cathode of another diode 136 is connected to the junction between transistor 124 and diode 134. The anode of diode 136 is connected to the collector of transistor 132. A resistor 138 connects the base and emitter of transistor 132.

The emitter of transistor 132 is also connected to the collector of an n-p-n transistor 140, positive power supply lead 24, as well as the cathode of a diode 142. The anode of this latter diode and the emitter of transistor 140 are connected to power lead 32. A resistor 144 joins the base and emitter of transistor 140.

The output of amplifier 116 is connected to the cathode of a Zener diode 146 which is in parallel with a capacitor 148. The anode of diode 148 is connected to the base of a p-n-p transistor 150, and also to a negative power supply voltage through a resistor 152.

The emitter of transistor 150 is joined to circuit ground through a resistor 154 connected in parallel to the series combination of a resistor 156 and a capacitor 158. The collector of transistor 150 is joined to the anodes of diodes 160, 162. The cathodes of diodes 160, 162 are connected to the base and collector, respectively, of an n-p-n transistor 164. The collector of transistor 164 is also connected to the base of a p-n-p transistor 166. The base and emitter of each of transistors 164, 166 are joined through resistors 168, 144, respectively.

Additionally, the collectors of transistors 132, 164 are joined, as are the emitters of transistors 140, 166. The collector of transistor 166 is connected both to the negative voltage power supply lead 26 as well as to power lead 32 through a diode 172, connected as shown.

In the preferred embodiment, the specific circuit structure of which has just been described, the following table lists the values and, where appropriate, model numbers, for the various components.

TABLE I

CIRCUIT COMPONENT VALUES

| Reference(s) | Value |
|---|---|
| Resistors: | |
| 50, 52 | 0.1 ohm, 5% wirewound |
| 56, 60, 64, 66 | 7.50K ohm, 0.1% |
| 58 | 100 ohm, Trim Pot |
| 72, 78 | 150K ohm 1% |
| 74 | 50K ohm, Trim Pot |
| 76 | 1.8M ohm |
| 88, 94 | 499K ohm, 1% |
| 92, 98 | 1K ohm |
| 110, 152 | 10K ohm |
| 126, 154 | 330 ohm |
| 128, 156 | 10 ohm |
| 138, 168 | 39 ohm |
| 144 | 11 ohm |
| Capacitors: | |
| 70 | 100 pF |
| 90, 96 | 4.7 pF |
| 130, 158 | 0.01 μF |
| 148 | 0.47 μF |
| Diodes: | |
| 134, 136, 160, 162 | 1N4608 |
| 142, 172 | BYW129-100 |
| 146 | 1N961, Zener |
| Transistors: | |
| 124, 164 | D40E7 |
| 132, 150 | D41E7 |
| 140 | D44H11 |
| 166 | D45H11 |
| Others: | |
| 68 | LM710C |
| 80, 100, 104 | 74LS132 |
| 82, 102, 106, 114 | 74LS02 |
| 116, 118, 120, 122 | INTEL 3245 |

Various voltage reference levels are used in this circuit. The power supply is a nominal 30 volts with lead 24 connected to a positive 30 volts and lead 26 connected to a negative 30 volts. The positive and negative voltages connected to opposite ends of resistor 74 is nominally 12 volts. Resistors 92 and 98 of the hysteresis circuits and enable circuit 108 are connected to reference voltages having a value of positive five volts. Finally, resistor 152 is connected to a reference voltage of minus 30 volts.

CIRCUIT OPERATION

Figure 3:
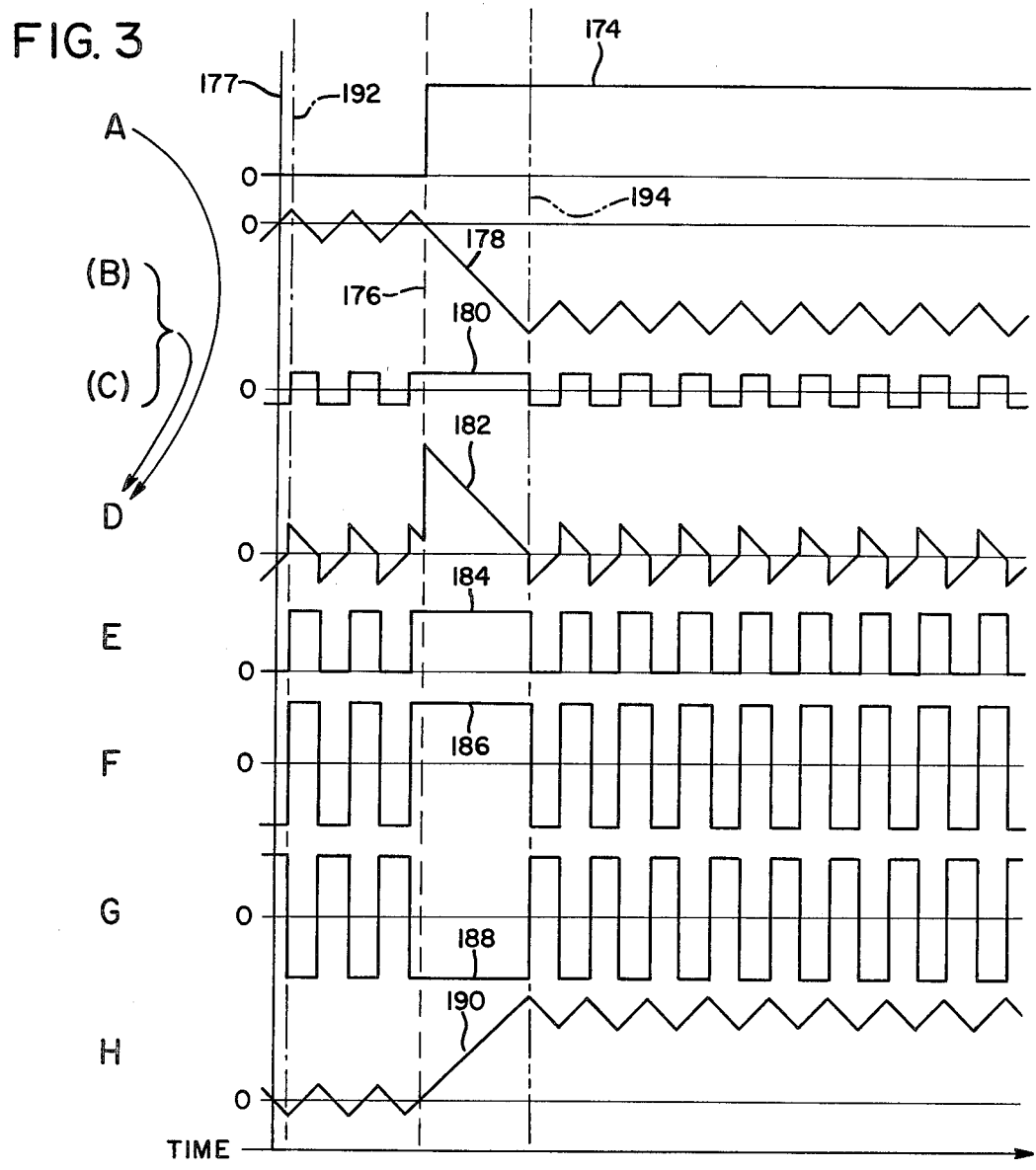
FIG. 3 is a timing diagram showing relative voltage and current levels at various locations within the circuit of FIGS. 1 and 2.

In discussing operation of the circuit of FIGS. 1 and 2, reference is also made to the timing diagram shown in FIG. 3. This diagram illustrates voltages and a current (along the vertical axes) existing in the circuit at specified locations in response to a change in the value of a control voltage applied to terminal 40.

Referring initially to the top waveform 174, a control voltage A, which is present on terminal 40 of the circuit, starts out at zero volts. At a subsequent point in time, identified by the position of vertical dash line 176 the control voltage increases to some known positive value corresponding to and relatable to, as will be discussed further later, a desired load current level.

At an initial point in time, $t_0$, shown in the timing diagrams of FIG. 3 as vertical solid line 177, the load current is zero. With no current flowing through resistors 50, 52, there is no voltage potential difference across lines 54, 62. As a result, conductors 36, 38 are both at zero volts, as is the differential voltage between them, identified as voltage B having waveform 178. Voltage B is shown in FIGS. 1, 2 with dashed arrows to illustrate that it is only a component of the net actual voltage appearing on conductors 36, 38.

The voltage on the input of comparator 68 due to the hysteresis circuits depends in part on the voltage existing on conductors 42, 44. In the preferred embodiment of this invention, the voltage corresponding to a logic "zero" is a voltage of zero volts. A logic "one" has a value of five volts. Therefore, if the output of comparator 68 is low, conductor 42 is at five volts and conductor 44 at zero volts. The actual voltage on the positive input terminal of comparator 68 will therefore be essentially zero volts. The voltage on the negative input terminal will be a small positive value due to the relative sizes of resistors 94, 78 and the equivalent resistance of crossover line 62. Since this voltage is applied to the negative terminal of comparator 68, the comparator is in a nonconducting state. This initial reverse biasing voltage is shown as a negative voltage C on waveform 180 in FIG. 3. As was the case with voltage B, voltage component C existing between conductors 36, 38 due to the hysteresis circuitry is shown with dashed arrows in FIG. 2.

The voltage labeled D represents the net differential input voltage across the comparator input terminals and is identified as waveform 182 in FIG. 3. Voltage D is equal to the sum of the components of voltage derived from control voltage A, load-current-indicating voltage B and bias voltage C.

There are also additional voltage components contributing to voltage D which should be discussed. For instance, a small voltage component originates from trim pot 74 which is used as a nulling circuit to compensate for inconsistencies in circuit components. In addition, trim pot 58 can be varied from its center-tap position in order to slightly unbalance cross-over network 28. This causes a small unbalanced voltage to occur on conductor 36 relative to conductor 38. This effects a change in the hysteresis bias on the input of comparator 68. This trim pot, then, also acts as hysteresis circuitry for influencing the operation of comparator 68.

The voltage appearing on conductor 44, which is nominally and logically equivalent to the actual output of comparator 68, is represented as voltage E which appears as waveform 184 in FIG. 3. It can be seen that this voltage varies from a value of zero to a positive value, which, as has been discussed, is nominally five volts. Voltage E is shown on conductor 44 rather than from the output of comparator 68 because the actual voltage on the output of comparator 68 tends to be sloppy compared to that on conductor 44. The voltage on conductor 42, being the logical opposite of voltage E, could also have been derived from conductor 44 in circuit 22.

As has been mentioned, enable circuit 108 acts as an on/off switch for switching circuit 22. When switch 112 is open, the corresponding NOR gate inputs are at a high value and the NAND gate inputs are at a low value. Since a NOR gate output is at a low level if any input is high and a NAND gate output is high if any input is low, these gates are maintained at high and low values, respectively, regardless of the output of switch controller 34. When switch 112 is closed, the NOR gates receive a low input and the NAND gates receive a high input, making them directly responsive to the voltages on conductors 42, 44.

Initally, the voltage on conductor 44 (voltage E) is low and that on conductor 42 is high and the outputs of NOR gate 100 and NAND gate 102 are low. This causes the outputs of amplifiers 116, 118 to be high. A high value at this point in the circuit is set at 12 volts. In this state, diode 146 is reverse biased and is maintained at +12 volts. With the base of transistor 150 at a near zero voltage, transistor 150 is turned off. As a result, diode 160 is non-conducting, and transistors 164, 166 are also in an off condition. This prevents the minus 30 volt power supply from being connected to conductor 32.

With the output of amplifier 118 high, transistor 124 is caused to conduct, which in turn causes diode 134 and transistors 132, 140 also to conduct. Thus, the positive power supply of 30 volts is applied to conductor 32.

A discussion of the operation of the upper portion of circuit 18, as controlled by the voltage on conductor 44, will be understood by tracing through the lower portion, as controlled by conductor 42, by assuming that conductor 42 has an initial low voltage value. In this case, the output of the logic elements are high, and correspondingly, the outputs of amplifiers 116, 118 are low. The anode of diode 146 and the base of transistor 150 are at minus 12 volts. With the emitter at a positive potential with respect to the base, the transistor conducts. Diode 160 is thereby forward biased and also conducts. This raises the base of transistor 164 which conducts, driving, in turn, transistor 166. The result is a connection between the negative power supply terminal 26 and lead 32.

With a low output from amplifier 118, transistor 124 is turned off, thereby preventing conduction of diode 134. This drops the base of transistor 132, turning it off which, also in turn, turns off transistor 140. This isolates the positive power supply on terminal 24 from conductor 32.

Relating this analysis back to the upper portion of circuit 18, negative power supply terminal 12 is actually connected to lead 30.

Thus, it can be seen that in this initial condition, a negative voltage, shown as F, exists on lead 30 and a positive voltage G exists on lead 32. These voltages are shown as waveforms 186, 188, respectively, in FIG. 3. Voltages F and G are always of equal and opposite polarity, resulting in a total voltage between leads 30, 32 of 60 volts, with only their relative polarities changing. Except for the very slight voltage drop across network in-line resistors 50, 52, this voltage is applied to load 12 through terminals 14, 16. The resulting load current passing through terminals 14, 16 is shown as current H having waveform 190.

With a relatively negative voltage applied to load 12, the load current tends to decrease in a ramping fashion as shown on waveform 190. As this happens a relatively positive differential voltage B is produced which offsets the relative negative bias voltage component C of comparator input voltage D.

At a point in time, $t_1$, identified as dash-dot line 192 in FIG. 3, voltage D increases in actual value, or decreases in absolute value, to a zero value when voltage B just equals and offsets voltage C. Ideally, this is the point in time at which comparator 68 switches its output value because at this point, the positive input terminal becomes positive with respect to the negative input terminal. As a result, voltage E changes to a high value and the voltage on conductor 42 correspondingly changes to a low value. The hysteresis voltage due to circuit 86 drops to zero and a corresponding positive voltage develops from circuit 84. Thus, voltage C is shown to jump from a negative value to a positive value. When added to an already positive voltage B, derived from the now negative current H, voltage D increases from zero to a level corresponding to the net change in voltage C.

Following the logic which has previously been described for the initial operating state of source 18, it will be understood that the voltages applied to leads 30, 32 and, therefore voltages F, G, respectively, are reversed. This is shown in waveforms 186, 188. Now, a relatively positive voltage is applied to load 12, causing its current to begin increasing, as shown in waveform 190. Without a change in control voltage A, this cycling of voltages due to switching of comparator 68 continues indefinitely.

Continuing to refer to FIG. 3, at time $c_2$, identified by dashed line 176, control voltage A is increased to some positive value. This value is related directly to a desired final current in load 12. In the preferred embodiment shown, based on various assumptions, at the time when the voltage on the two inputs to comparator 68 are equal, the load current is approximately equal to the control voltage times a gain constant equal to the value of one of the resistors in cross-over lines 54, 62 divided by the product of the resistance of either resistor 72 or 78, which are equal, times that of either resistor 50 or 52, both of which are also equal. Applying the values of these resistances, the magnitude of the load current in amperes is approximately equal to one-half the magnitude of the control potential in volts. In arriving at this equation, it has been assumed that in-line resistors 50, 52 are substantially less in value than each of the cross-over line resistances, and that the hysteresis circuit resistors 88, 94 are substantially greater than the individual resistances disposed within cross-over lines 54, 62. Also, the contribution of resistance from trim pot 58 was disregarded.

Although this computation of gain constant is not exact, it is sufficient to show that for each value of control voltage applied to supply circuit 10, there is a corresponding load current value which will be established in response thereto.

Referring again to FIG. 3, when voltage A is increased, a relative voltage imbalance is created on the two comparator input terminals. Since load terminal 14 was positive with respect to terminal 16 at the time of change in voltage A, load current H was increasing and the resulting load-current-indicating voltage B was decreasing. The increase in voltage A was consistent with this condition, thereby causing no immediate switching of comparator 68. Load current H continues to ramp positively until a subsequent point in time $t_3$, identified by vertical dash-dot-dot line 194. At this point in time, component voltages A, B, C sum to a zero value, as shown in waveform 182, thereby causing comparator 68 to switch. The circuit operation and corresponding voltage responses are the same from time $t_3$ on as was previously discussed for a zero control voltage A.

It is apparent that the current supply circuit, whose structure and operation has been described as the preferred embodiment for practicing the present invention, satisfies the various objects and advantages described. It will be understood by those skilled in the art that other changes in form and detail may be made therein without departing from the spirit and scope of the invention as defined in the following claims. For instance, one of the in-line resistors may be removed without substantially effecting operation of the circuit, although a slight non-zero common mode voltage is introduced into voltage B thereby. Yet by doing so, the circuit gain constant is essentially doubled, i.e., the magnitude of load current is approximately equal to that of the control voltage.

Explaining another example, the transistors which have been included in switching current source 18 were chosen for their high-speed switching capabilities. It would be possible to replace them with more conventional, and therefore less expensive, transistors by introducing a D-type flip-flop at the output of comparator 68. This flip-flop, when driven by a 10 micro-second clocking signal, would allow comparator 68 to stabilize during the time periods when it is switching. It is possible for it to produce an erroneous output during that time, which in turn can cause erroneous switching with conventional transistors without the flip-flop in the circuit.

It is claimed and desired to secure by Letters Patent:

1. A switching current supply circuit, responsive to a control voltage, for controlling the current flowing in an inductive load comprising
    a pair of terminals adapted for connection to such a load,
    means operatively connected to said terminals for producing a voltage indicative of the current flowing through any such load connected to the terminals, said means for producing including a pair of leads, and a bridge network associated therewith structured to apply said load-current-indicating voltage across said leads, with said leads having voltages of opposite polarity,
    comparator means, responsive to a differential input voltage including components derived at least in part from such a control voltage and from said load-current-indicating voltage, such voltage components tending, when added, to null one another, for generating a switched output voltage having one of two distinct values, each of said values indicating one of the two possible relative polarities of said input voltage, and
    a polarity-changeable voltage source operatively connected to said producing means, and therethrough to said terminals, for applying, selectively and reversibly, and in response to said output voltage, known voltages of opposite polarity to said terminals, which known voltage is have, in one operating state of the circuit, one known polarity respecting said terminals, and in a second operating state, the reverse polarity respecting the terminals, said operating states effecting a change in load current level appropriate to decrease the absolute value of said input voltage.

2. The circuit of claim 1, wherein said network includes in-line resistance means in series with each of said terminals, and a pair of generally balanced cross-over lines, with one end of each cross-over line connecting the load side of one of said in-line resistance means to the non-load side of the other in-line resistance means, each of said cross-over lines containing intermediately tappable resistance means each connected through a tap to a different one of said two leads.

3. The circuit of claim 2, wherein the resistance values of said in-line resistance means are substantially equal, and said resistance means coact with other elements in said circuit to assure that the voltages applied to said terminals are of substantially equal magnitude.

4. The circuit of claim 2, wherein said cross-over-line-disposed resistance means are substantially equal, and said taps generally bisect the resistance within each of said cross-over-line-disposed resistance means.

5. A switching current supply circuit, responsive to a control voltage, for controlling the current flowing in an inductive load comprising
    a pair of terminals adapted for connection to such a load,
    means operatively connected to said terminals for producing a voltage indicative of the current flowing through any such load connected to the terminals,
    comparator means, responsive to a differential input voltage including components derived at least in part from such a control voltage and from said load-current-indicating voltage, such voltage components tending, when added, to null one another, for generating a switched output voltage having one of two distinct values, each of said values indicating one of the two possible relative polarities of said input voltage,
    hysteresis means operatively connected to said comparator means for delaying switching therein by a known period of time progressing from the point in time when the magitude of the component of said input voltage derived from said load-current-indicating voltage is equal in absolute value to but opposite in polarity from that of the component derived from the control voltage, and
    a polarity-changeable voltage source operatively connected to said producing means, and therethrough to said terminals, for applying, selectively and reversibly, and in response to said output voltage, known voltages of opposite polarity to said terminals, which known voltages have, in one operating state of the circuit, one known polarity respecting said terminals, and in a second operating state, the reverse polarity respecting the terminals, said operating states effecting a change in load current level appropriate to decrease the absolute value of said input voltage.

6. The circuit of claim 5, wherein said hysteresis means includes means for including as a component of said input voltage a known changeable-polarity offset voltage having, when viewed at a moment in time which is immediately after said comparator switches said output voltage, a polarity which is the same as that of the then sum of the components of said input voltage derived from the control voltage and from the load-current-indicating voltage.

7. The circuit of claim 5, wherein said hysteresis means is adjustable to change the length of said known period.

* * * * *